Oct. 10, 1950 W. R. KOCH 2,525,359

FREQUENCY MODULATION RECEIVER TUNING AID

Filed April 4, 1946

INVENTOR
Winfield R. Koch.
BY H.S. Grover
ATTORNEY

Patented Oct. 10, 1950

2,525,359

UNITED STATES PATENT OFFICE 2,525,359

FREQUENCY MODULATION RECEIVER TUNING AID

Winfield R. Koch, Haddonfield, N. J., assignor to Radio Corporation of America, a corporation of Delaware Application April 4, 1946, Serial No. 659,472

2 Claims. (Cl. 250—20)

My present invention relates generally to improved tuning aids for angle modulated carrier wave receivers, and more particularly to novel means for obtaining improved tuning characteristics and reducing inter-channel noise in frequency modulated carrier wave (FM) receivers.

In tuning a receiver of angle modulated carrier waves, such as a conventional FM receiver, the user is confused, because he finds spurious maximum sound output points, including substantial but distorted signal components, on either side of the correct tuning position of the station selecting device. Additionally, in tuning an FM receiver it is found that there is a relatively sharp increase in noise on either side of the correct tuning position, accompanying the aforesaid spurious signal components. Detection occurs in the case of an FM receiver along a curve somewhat resembling the letter S and possessing three successive slopes along which detection may occur, although proper reception can be obtained only on the middle slope. By virtue of the fact that signal reception, accompanied by distortion and noise, may be obtained when the FM receiver is tuned away from the correct center frequency position, the set user may even feel that his receiver is defective rather than incorrectly tuned.

It may, therefore, be stated that it is one of the main objects of my present invention to provide an improved aid to manual tuning of a receiver of angle modulated waves, maximum sound output occurring only at the correct tuning position of the station selector device for a given carrier channel. More specifically, I obtain such results in an FM receiver, together with reduction of signal distortion and inter-channel noise.

In carrying out the object of my invention, I employ a squelch circuit for the modulation frequency (generally audio frequency) controlled from the detector circuit wherein an audio frequency amplifier of the system includes the squelch circuit as a part thereof whereby the amplifier is substantially operative only when the receiver is tuned near the center, or mid-band, frequency of the received waves.

Another object of my invention is to provide, in an FM receiver of the frequency-dividing, locked-in oscillator type, an audio frequency amplifier adapted to squelch the receiver in the absence of received FM signals, the locked-in oscillator normally being operative at a divided frequency above or below the center frequency of the FM detector.

Yet other objects of my invention are to provide tuning aids for FM receivers which are reliable in operation, and can be economically manufactured and assembled.

Still other features of my invention will best be understood by reference to the following description, taken in connection with the drawing, in which I have indicated diagrammatically several circuit organizations whereby my invention may be carried into effect.

In the drawing:

Fig. 1 shows a circuit diagram of an FM receiver employing one embodiment of my invention;

Fig. 1*a* shows a conventional FM detector characteristic;

Figure 1:
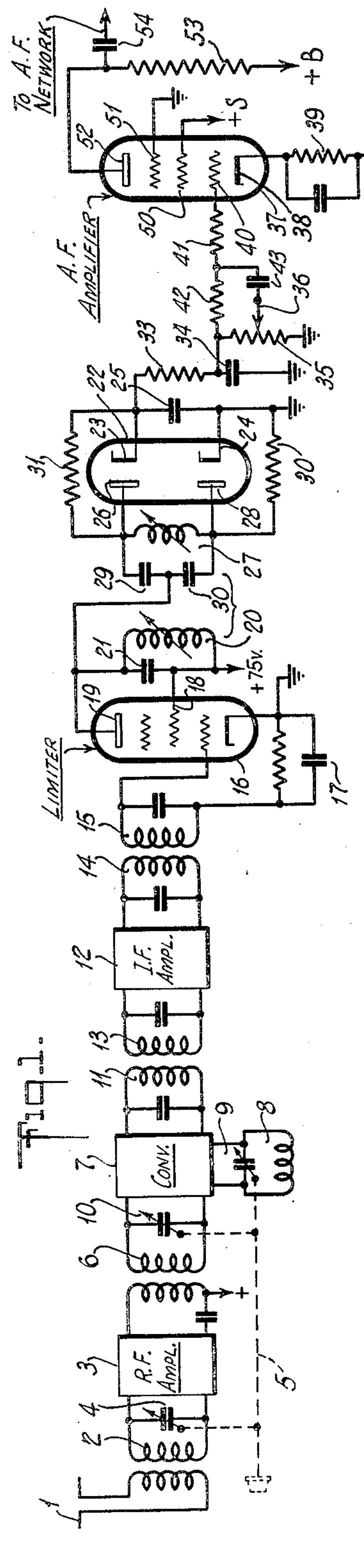

Referring now to Fig. 1, there are shown therein the circuit connections of only so much of an FM receiver as is necessary to a proper understanding of the present invention. The remainder of the system is schematically represented, since those skilled in the art of radio communication are fully aware of the apparatus required. It is well known that in present FM broadcast reception the superheterodyne type of receiver is widely employed. My invention is not restricted to any particular band of FM reception. The generic term "angle modulated wave" covers both frequency and phase modulated waves, as well as hybrid modulations possessing characteristics common to both. The present assigned channel width for each FM stage is 200 kc. It is to be understood that the present invention is in no way restricted to any given channel width for each FM station.

Assuming for the purpose of specific illustration that the receiver shown in Fig. 1 is designed to receive FM stations in the present assigned FM band of 88–108 mc., although the band may be 42–50 mc., the FM waves are collected by any desired type of signal collector device. For example, the dipole 1 is coupled to the tunable signal selector input circuit 2 of a radio frequency amplifier 3. The selector circuit 2 is provided with a tuning reactance, which may be a variable condenser 4, and the station selector device 5 of any suitable construction is arranged to vary the capacitance of condenser 4 to a value such as to tune the circuit 2 to the mid-band, or center, frequency of a desired FM station. The amplified radio frequency signal energy, after proper selection, may be selectively amplified in one or more additional stages of radio frequency amplification prior to impression of the FM waves upon the tunable input circuit 6 of the first detector, or converter, stage 7.

As is well known, the converter 7 is provided with a local oscillator network, either independent of the converter tube or combined therewith, whose tank circuit 8 is tunable by variable condenser 9 over a range of local oscillator frequencies which differ from frequencies of the signal frequency range by the constant value of the intermediate frequency (I. F.). The I. F. value may be, for example, 10 mc., or any other frequency value. The station selector device 5 concurrently varies the capacitance of each of variable condensers 4, 10 and 9 so that there is produced in the resonant output circuit 11 of the converter 7 signal energy whose mid-band, or center, frequency has the I. F. value of 10 mc. The I. F. energy produced at output circuit 11 can be amplified by an I. F. amplifier network 12. The latter may include one or more I. F. amplifier tubes. Numerals 13 and 14 indicate respectively the input and output circuits of the I. F. amplifier, while numeral 15 indicates the resonant input circuit of the following amplitude limiter tube 16. It will be understood that each of resonant circuits 11, 13, 14 and 15 is tuned to the operating I. F. value.

The limiter circuit may be of any suitable and well-known construction, and includes a resistor-condenser network 17 in the low potential side of its input circuit 15 so as to provide grid limiting action on the negative half cycles of the signal waves. The screen grid 18 and plate 19 are respectively operated at a relatively low positive voltage of +75 volts thereby to provide plate limiting on the positive half cycles of the signal input waves. In circuit with the plate 19 there is included a parallel resonant circuit consisting of coil 20 shunted by condenser 21. The circuit 20, 21 is tuned to the operating I. F. value, and constitutes the primary circuit of the FM discriminator network.

The limiter tube is followed by an FM detector circuit which is generally a discriminator-rectifier circuit of the type disclosed and claimed by S. W. Seeley in his U. S. Patent No. 2,121,103 granted June 21, 1938. More specifically, I have shown an FM detector circuit whose specific construction has been disclosed and claimed by me in my application Serial No. 529,074, filed April 1, 1944, now Patent No. 2,410,983 issued November 12, 1946. It is to be clearly understood, however, that my present invention is in no way limited to the specific form of FM detector circuit shown, since the squelch control circuit utilized herein will function satisfactorily in conjunction with any other suitable type of FM detector circuit. Before describing the circuit details and functioning of the squelch, or muting, network, there will be described the remainder of the FM receiver system and the problem sought to be solved by my present invention.

A pair of opposed diode rectifiers are shown located in a common tube envelope 22, as in a 6H6 type tube. The cathodes 23 and 24 of the respective diodes are coupled by capacitor 25, cathode 24 being directly grounded. The anode 26 of the upper diode is connected to the upper end of the secondary coil 27, while the anode 28 of the lower diode is connected to the lower end of secondary coil 27. The coils 20 and 27 are magnetically coupled, and coil 27 is shunted by the condensers 29 and 30 which are connected in series. The secondary circuit 27, 29, 30 is resonated to the operating I. F. value, and the high potential side of primary coil 20 is directly connected to the junction of condensers 29 and 30. The arrows through coil 20 and 27 indicate that these coils are adapted to have their inductance values adjustable thereby to provide means for adjusting the frequency of the respective primary and secondary circuits of the discriminator network. Under present standards of FM broadcast reception, the frequency swing may be up to a maximum of 150 kc., i. e. the deviation on each side of the mean frequency may be up to 75 kc. All of the resonant circuits mentioned herein are designed to respond efficiently to the full swing of the received signal, which may be over the above or other suitable frequency range.

Due to the direct connection from the primary circuit 20, 21 to the junction of condensers 29 and 30, the primary voltage is applied in parallel to each of anodes 26 and 28. Concurrently, the magnetic coupling of the coils 20 and 27 results in the application of the secondary circuit voltage to the anodes 26 and 28 in opposed phase relation. Hence, at each of the anodes 26 and 28 there will exist a quadrature phase relation between each of the pair of the aforesaid secondary voltage and the primary voltage components. This quadrature phase relation exists solely when the I. F. energy at circuit 20, 21 is at the mid-band, or center, frequency of the response curves of circuits 20, 21 and 27, 29, 30. Hence, the resultant voltages at each of anodes 26 and 28 will be equal for the "in-tune" condition.

There are developed rectified voltages across the respective load resistors 30 and 31 shunted directly between the anode and cathode of each diodes 24, 28 and 23, 36. Since the cathode 24 is grounded and resistors 30 and 31 have a direct current connection through input coil 27, the cathode end of resistor 31 will have an effective, or resultant, rectified voltage which is the differential of the voltages across load resistors 30 and 31. This differential voltage is representative of the modulation signal which was originally applied to the FM carrier wave at the FM transmitter station. Condenser 25 is an I. F. bypass condenser, and is shunted by resistor 33 in series with condenser 34. The lower end of condenser 34 is grounded. Condenser 34 is shunted by resistor 35. The resistor 35 is high in value compared to the diode load resistors, and, therefore, has little effect on the detector output. The slider 36 takes off from resistor 35 a desired amplitude of audio frequency voltage.

Figure 1A:
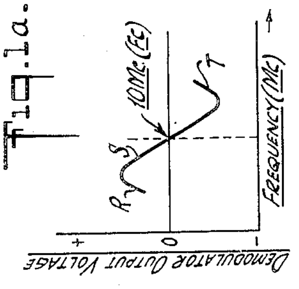

The FM detection characteristic, shown in Fig. 1*a*, is well known to those skilled in the art of FM radio communication. It is characterized by a pair of spaced peaks located under proper tuning conditions at, or beyond, the limits of the frequency swing of the FM waves. On either side of the spaced peaks, and between the peaks, there exist slopes R, S and T thereby making it possible for the detector to detect on any one of the three slopes of the characteristic. The correct tuning position is at the center of the inclined slope S between the spaced peaks. That is, with correct tuning the mean I. F. value corresponds with the center of the response curves of the primary and secondary circuits of the discriminator network, and is located at the center of the slope between the spaced peaks of the FM detection characteristic. This is indicated as the mid-band frequency in Fig. 1*a* by the illustrative value of 10 mc.

In accordance with my present invention I provide a simple means for substantially preventing response of the receiver system beyond the spaced peaks, or on slopes R and T, of the curve shown in Fig. 1*a*. This is accomplished by using as the first audio amplifier tube 37 a pentode of the 6AS6 type, or any equivalent type. The tube 37 has its cathode 38 connected to ground through the bypassed cathode resistor 39. The signal input, or control, grid 40 is connected to the cathode end of load resistor 31 through a path consisting of resistors 41, 42 and resistor 33. This path permits solely direct current voltage to be applied to grid 40 which is responsive in magnitude and polarity to the relatively slow frequency change of the I. F. signals at the discriminator input circuit with respect to the predetermined frequency Fc (10 mc.).

The audio voltage across condenser 34 is taken off by voltage divider 35, 36, and is applied over condenser 43 and resistor 41 to grid 40. In the absence of signals, or when the receiver is accurately tuned so that the I. F. signals have a center frequency equal to 10 mc., the voltage drop across resistor 39 determines the bias of grid 40 and the gain of tube 37 is normal. However, should the receiver be inaccurately centered, or detuned, relative to the center frequency of a desired station, then the gain of tube 37 is quickly decreased.

The screen grid 50 is connected to a point +S of positive direct current voltage, while suppressor grid 51 is grounded. The plate 52 is connected through output, or load, resistor 53 to the +B terminal of a direct current source. The screen and plate may have up to +120 volts applied to them. The condenser 54 connects the upper end of plate resistor 53 to the following audio amplifier input grid. The following audio amplifier is not shown, nor is the ultimate signal reproducer which may be a loudspeaker.

Resistor 42 permits direct current voltage to be applied to grid 40, but blocks out the audio voltage from the top of the voltage divider 35. The resistor 42 was included to keep large amounts of grid current from flowing when the signal is mistuned, and audio voltages present, thus permitting the average bias to assume a less negative bias than would be possible without the resistor. This insures a higher drop in the cathode resistor. Without resistor 42 the capacitor 43 (or 78 in Fig. 2) will be charged by grid current due to audio frequency voltages present on the grid 40 thereby causing the average bias to be more negative than when no audio voltage is present. Resistor 41 will take out audio voltage only when the grid 40 becomes positive with respect to the cathode, which will be only on mistuning. With a correctly tuned signal, the audio currents which flow through resistor 41 will be extremely small, and little drop through this resistor will occur. Positive voltage on grid 40 should occur only on considerable mistuning; in such case distortion produced by virtue of grid current flow is not important. In addition, the plate current is cut off by suppressor grid 51 thereby silencing the receiver as will now be explained.

Let it be assumed that the receiver is mistuned so that the potential at the cathode end of resistor 31 is negative relative to ground. This will occur if the applied I. F. signals at coil 20 have a center or mean frequency to that side of 10 mc. which will cause diode 24, 28 to draw more current than the other diode. The grid 40 is, therefore, biased more negative than its normal bias, and the gain of tube 37 will be greatly reduced or cut-off. It will be seen from Fig. 1*a* that a frequency shift of the FM signals above the value Fc produces the negative bias for reducing the gain of tube 37. Obviously the negative bias will increase as the slope T is approached. Not only is the output decreased, but considerable distortion results as the upper frequency peak is approached. Hence, the listener cannot be confused by tuning over slope T, for here the negative bias will produce such distortion, and even cut-off, that the operator will of necessity realize that he is detuning the receiver.

If the receiver is tuned below the center frequency of the desired station, or towards the low frequency peak, then the upper diode 23, 26 draws more current. Hence, the voltage at cathode 23 is positive relative to ground. The grid 40 being driven positive, the result will be to cause screen grid 50 to collect more electrons. The screen current flow will increase thereby making the cathode 38 more positive. The effect of the cathode 38 becoming more positive relative to ground is to cause the grid 51 to become more negative with respect to the cathode 38, thereby causing the current flow to plate 52 to decrease and even be cut off. Here, again, the increase of positive voltage at grid 40 causes reduction of tube gain, distortion and cut-off condition. Therefore, the operator is readily able to tell that he is detuning the FM receiver from the correct center frequency Fc. An important advantage of my invention is that the tuning aid device is provided by no auxiliary circuits or elements, but consists of the existing electrodes of the audio amplifier tube.

Figure 2:
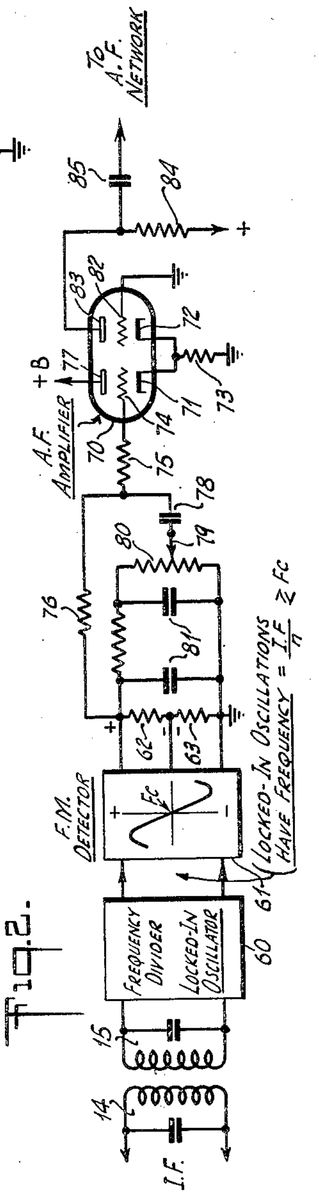
Fig. 2 shows another embodiment of my invention.

The invention is not limited to the particular form of audio amplifier shown, nor to use with an FM receiver employing a limiter prior to the FM detector. In Fig. 2 I have shown in schematic form a portion of an FM receiver of the type using a frequency divider of the locked-in oscillator type. The I. F. transformer 14, 15 is assumed to feed a locked-in oscillator form of frequency divider of the type shown by George L. Beers in U. S. Patent No. 2,356,201, granted August 22, 1944. Reference is made to that patent for a detailed explanation of the circuit. It is sufficient for the purpose of this application to point out that the signal output voltage of divider 60, schematically represented, is a predetermined subharmonic of the I. F. For example, the center frequency of the I. F. signals may be divided by a factor 5 whereby the signals applied to FM detector 61 have a center frequency of 2 mc. with an overall swing of 30 kc. The detector is assumed to be that shown in the aforesaid Seeley patent.

However, in accordance with my invention the selective output circuit of the locked-in oscillator is naturally resonant at a frequency such that in the absence of I. F. signals at input circuit 15 there will be produced subharmonic oscillations of a frequency greater, or less, than Fc. In other words, if Fc is equal to 2 mc. (the balance or center frequency of FM detector 61) then the natural frequency of the oscillatory output of divider 60 is above, or below, 2 mc. by a predetermined frequency value. For example, the frequency could be 1.985 mc. or 2.015 mc., which are at the extreme deviations of the signal. When the FM signals are received, however, they lock in the subharmonic oscillations at the center frequency Fc, and the locked-in oscillations vary in frequency over the reduced deviation range but in a manner corresponding to the deviation of the received FM signals.

The detector 61 has its output resistors 62 and 63 connected as described by S. W. Seeley in his aforesaid patent, with the rectified voltages thereacross being in polarity opposition. Hence, when signals applied to the FM detector input circuit have the correct center frequency Fc, the effective direct current voltage at the upper end of resistor 62 is zero. However, in the absence of received FM signals, the subharmonic oscillatory output frequency of divider 60 is off to one side of the Fc say to 2.015 mc., and, therefore, there will be developed more voltage across one of resistors 62, 63 than across the other. Depending on whether the "unlocked" normal subharmonic oscillations are less or greater than Fc, the effective direct current voltage at the upper end of resistor 62 will be respectively positive or negative.

I take advantage of this situation by providing the multi-grid audio amplifier tube circuit subsequent to resistors 62, 63 as in Fig. 1, or I may use the modified audio amplifier of Fig. 2. In Fig. 2 the twin triode tube, or two separate triode tubes, 70 has its cathode 71 and 72 connected in common to ground through resistor 73. The input grid 74 of the first triode is connected through series resistors 75 and 76 to the upper end of resistors 62. The plate 77 of the first triode is connected to the +B terminal of a suitable direct current source, while the audio voltage is applied to grid 74 through condenser 78 connected to the slider 79 of a potentiometer 80. The latter is connected across the paralleled condensers 81 which filter off the subharmonic currents, and provide any desired de-emphasis of the higher audio frequencies.

The grid 82 of the second triode of tube 70 is connected to the grounded end of cathode resistor 73, while plate 83 is connected through output load resistor 84 to a suitable source of positive voltage. The amplified audio voltage across resistor 84 is passed through condenser 85 to the following audio utilizing network.

It will now be shown that there can be no audio voltage developed across output resistor 84 unless the locked-in oscillations at the input circuit of FM detector 61 have a center frequency approximately equal to Fc. The characteristic shown in the rectangle 61 denotes that if the signals applied to detector 61 have a center frequency less than Fc, the effective voltage applied over resistors 76 and 75 to grid 74 will be positive relative to ground. This will cause more current to flow through resistor 73, and the effect will be to increase the negative bias of grounded grid 82. As a result the plate current through resistor 84 will be cut off.

If the center frequency of the signals at the detector input is greater than Fc, there will be negative voltage applied to grid 74. The increase of negative bias on grid 74 will cut off the input triode, and no audio signal transmission can take place. As stated before, in the absence of received FM signals the receiver will be quiet, because the output of oscillator 60 will be of a frequency either greater or less than Fc, and in either case there will be no voltage across resistor 84. The system shown in Fig. 2 will be quiet at all times, except when correctly tuned to a station actually being received.

Figure 3:
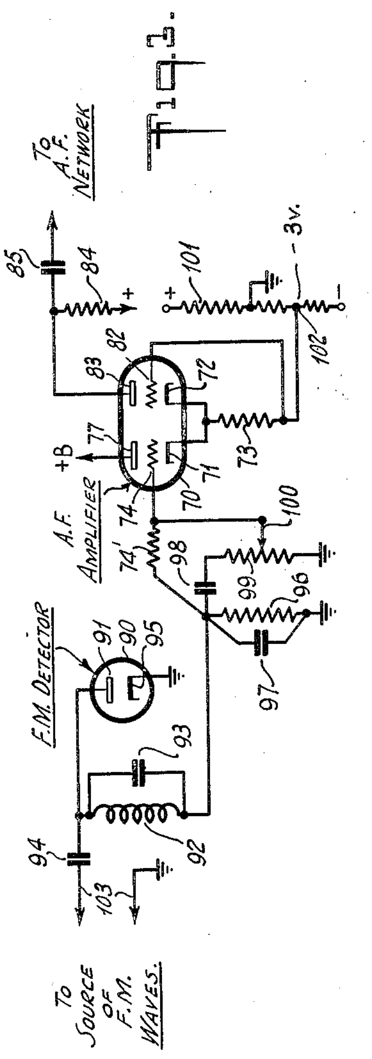
Fig. 3 shows a modified embodiment of the system of Fig. 2.

My invention is not restricted to use with balanced FM detectors, and in Fig. 3 I have shown the amplifier tube 70 of Fig. 2 applied to a single-ended FM detector of the type shown by Saul Solomon in his application Serial No. 615,351, filed September 10, 1945. In Fig. 3 the single-sided FM detector is similar to that shown in Fig. 4 of the aforesaid Solomon application, and comprises a diode rectifier 90 whose anode 91 is connected to the high alternating potential side of an input circuit consisting of coil 92 and shunt condenser 93 parallel resonant to a predetermined frequency. Condenser 94 connects the high potential side of coil 92 to the high potential signal input terminal. The cathode 95 is returned to the grounded end of the load resistor 96 shunted by high frequency bypass condenser 97. The ungrounded end of resistor 96 is connected to the low potential end of coil 92. The audio voltage is developed across the load resistor 96. The voltage divider 98, 99 is shunted across load resistor 96, and slider 100 takes off from resistor 99 a desired magnitude of audio voltage.

The direct current voltage component across resistor 96 is utilized in conjunction with the twin triode tube 70. As a matter of fact, the action in this case is quite similar to the action described in connection with Fig. 2. It will be noted that the control grid 74 of the input triode of tube 70 is connected by resistor 74' to the ungrounded end of load resistor 96. Accordingly, there is applied to the grid 74 both audio voltage and direct current voltage, as is the case in the circuits of Fig. 2 and Fig. 1.

The cathode 71 and 72 are connected in common through the cathode resistor 73 to a predetermined negative voltage point on voltage divider 101. Assuming that the midpoint of voltage divider 101 is grounded, the lower end of resistor 73 will be connected to point 102 which may have a negative voltage of about −3 volts. The grid 82 of the output triode of tube 70 is connected to the lower end of resistor 73. In the presence of received signals correctly tuned the grid 74 will have sufficient negative bias with respect to the cathode for distortionless amplification. Hence, the input triode of tube 70 will be in cut-off condition when the receiver is mistuned, since if grid 74 is biased negatively the input triode of tube 70 will be cutoff. However, if grid 74 is rendered less negative with respect to cathode 71 the current flow through resistor 73 increases, and causes grid 82 to cut off the output triode thereby preventing audio voltage from appearing across resistor 84. Hence, if the negative voltage is of the right amount (as when the signals are correctly tuned in) the audio amplifier is operative. The "right amount" is the same as the voltage drop between ground and point 102.

The source of FM waves connected between condenser 94 and ground may be a frequency divider of the locked-in oscillator type, as explained in the Solomon application. In that case, the source of FM waves has an output current flow of substantially constant amplitude. In this case, it is desirable to so design the oscillator circuit that in the absence of signals, the oscillator frequency will be substantially different from the center frequency that the amplifier is rendered inoperative, as in Fig. 2. However, it is also possible to couple the condenser 94, Fig. 3, to the output circuit of a limiter tube such as is shown at tube 16 in Fig. 1 of this application. In any case, the discriminator input circuit of diode 90 has series and shunt resonances so controlled that the slope of the frequency response curve of the entire network is linear, and is sufficiently steep to provide a maximum linear rectified output over the entire frequency swings or deviations over the FM signals at the input leads 103.

It is believed sufficient for the purposes of this application to explain that coil 92 of the diode input circuit has a shunt resonant frequency which is caused by the combination of coil 92 and shunt condenser 93. The tube capacity, that is the capacity between anode 91 and cathode 95, combines with condenser 97 to place a shunt capacity across tuned circuit 92, 93. The series resonance of the network is provided by the combination of condenser 97 with parallel resonance circuit 92, 93. The constants of the input circuit of diode 90 will be so chosen that circuit 92, 93 is tuned to the series resonance point of the frequency vs. detector output voltage characteristic.

As explained in the aforesaid Solomon application, the input network of diode 90 has a sloping characteristic such that the series resonance point falls below the center frequency by a frequency value substantially equal to the frequency spacing between the center frequency and the shunt resonance frequency. Of course, when the FM signals applied to leads 103 have a center frequency equal to the predetermined center frequency of the input network characteristic, then the grid 74 will have its normal operating bias such that the output triode will have complete and normal gain. However, should the center frequency of the applied FM signals depart somewhat from the mid-frequency of the detection characteristic, then the resultant voltage applied to grid 74 will either cut off the input triode or cut off the output triode of tube 70, as the case may be.

While I have indicated and described several systems for carrying my invention into effect, it will be apparent to one skilled in the art that my invention is by no means limited to the particular organizations shown and described, but that many modifications may be made without departing from the scope of my invention.

What I claim is:

1. The combination with a pair of opposed rectifiers having a frequency descriminator input circuit and a signal detection response characteristic with undesired detection slopes beyond the limiting frequencies of the useful portion of the characteristic, of a locked-in oscillator of the frequency divider type having a resonant input circuit tuned to a harmonic of the mid-frequency of said response characteristic and a resonant output circuit naturally resonant at a frequency within the limiting frequencies of the useful portion of said response characteristic, said oscillator output circuit being coupled with said discriminator input circuit, a first audio ampliger device having cathode, grid and anode elements, means for applying a direct-current voltage component and an audio-frequency voltage component of the differential voltage output of the rectifiers to said grid, means for maintaining said oande at a fixed potential, a second audio amplifier device having cathode, grid and anode elements and an anode circuit connected as an audio amplifier output circuit, a resistor commo to the cathode elements of both of said devices and connected ground, means providing a conductive circuit connection from the grid of the second named device to ground for maintaining said grid at a fixed potential.

2. The combination with a detector having a frequency discriminator input circuit and a signal detection response characteristic with undesired detection slopes beyond the limiting frequencies of the useful portion of the characteristic, of a locked-in oscillator of the frequency divider type having a resonant input circuit tuned to a harmonic of the mid-frequency of said response characteristic and a resonant output circuit resonant at a frequency within the limiting frequencies of the useful portion of said response characteristic, said oscillator output circuit being coupled with said discriminator input circuit, an audio amplifier device having cathode, grid and anode elements, means for applying a direct-current voltage component and an audio-frequency voltage component of the differential voltage output of the detector to said grid, a second device having cathode, grid and anode elements and an anode circuit connected as an audio amplifier output circuit, a resistor common to the cathode elements of both of said devices and connected between said cathode and a point of fixed potential, and circuit means conected between the grid of said second device and said point of fixed potential for maintaining said grid at said fixed potential.

WINFIELD R. KOCH.

REFERENCES CITED

The following references are of record in the file of this patent:

UNITED STATES PATENTS

| Number | Name | Date |
|---|---|---|
| 2,235,550 | Fyler | Mar. 18, 1941 |
| 2,276,565 | Crosby | Mar. 17, 1942 |
| 2,334,190 | Goldstine | Nov. 16, 1943 |
| 2,362,806 | Dome | Nov. 14, 1944 |
| 2,369,585 | Lyman | Feb. 13, 1945 |
| 2,412,482 | Vilkomerson | Dec. 10, 1946 |
| 2,416,795 | Crosby | Mar. 4, 1947 |
| 2,433,377 | Le Grand | Dec. 30, 1947 |